(12) United States Patent
Ikeda et al.

(10) Patent No.: US 12,464,642 B2
(45) Date of Patent: Nov. 4, 2025

(54) WIRING CIRCUIT BOARD AND METHOD OF PRODUCING THE WIRING CIRCUIT BOARD

(71) Applicant: NITTO DENKO CORPORATION, Osaka (JP)

(72) Inventors: Takahiro Ikeda, Osaka (JP); Kyotaro Yamada, Osaka (JP); Taketo Ishikawa, Osaka (JP); Hironori Kuwayama, Osaka (JP); Yuki Takeda, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 162 days.

(21) Appl. No.: 18/330,058

(22) Filed: Jun. 6, 2023

(65) Prior Publication Data
US 2023/0413431 A1   Dec. 21, 2023

(30) Foreign Application Priority Data

Jun. 15, 2022  (JP) .................................. 2022-096919
Oct. 20, 2022  (JP) .................................. 2022-168719

(51) Int. Cl.
*H05K 1/05* (2006.01)
*H05K 1/02* (2006.01)
(Continued)

(52) U.S. Cl.
CPC ............. *H05K 1/0298* (2013.01); *H05K 1/05* (2013.01); *H05K 1/09* (2013.01); *H05K 3/4038* (2013.01);
(Continued)

(58) Field of Classification Search
CPC .......... H05K 1/0298; H05K 1/05; H05K 1/09; H05K 3/4038; H05K 3/4673;
(Continued)

(56) References Cited

U.S. PATENT DOCUMENTS 5,731,047 A * 3/1998 Noddin ................ H05K 3/0035
427/532
2006/0199402 A1 * 9/2006 Ishii ........................ H05K 1/056
439/66

(Continued)

FOREIGN PATENT DOCUMENTS

JP   2000-309887 A   11/2000
JP   2019-212659 A   12/2019

(Continued)

OTHER PUBLICATIONS

English Translation JP2000309887, Mitsui Chemicals Inc. Morita et al. Published Nov. 7, 2000 (Year: 2000).*

*Primary Examiner* — Steven T Sawyer
(74) *Attorney, Agent, or Firm* — Edwards Neils LLC; Jean C. Edwards, Esq.

(57) ABSTRACT

A wiring circuit board includes a metal supporting layer, a first metal thin film, an insulating layer including a through hole, a second metal thin film disposed on the first metal thin film in the through hole, and a conductive pattern electrically connected to the metal supporting layer through the first metal thin film and the second metal thin film in the through hole. The first metal thin film includes an oxide coating at least on a contact surface in contact with the insulating layer. In the central part of the through hole, the oxide coating has a thickness of 0 or a thickness smaller than a thickness of the oxide coating on the contact surface.

6 Claims, 5 Drawing Sheets

(51) Int. Cl.
    *H05K 1/09*           (2006.01)
    *H05K 3/40*           (2006.01)
    *H05K 3/46*           (2006.01)

(52) U.S. Cl.
    CPC ... *H05K 3/4673* (2013.01); *H05K 2201/0338* (2013.01); *H05K 2201/09563* (2013.01)

(58) Field of Classification Search
    CPC ....... H05K 3/4076; H05K 2201/09563; H05K 3/427; H05K 3/44
    See application file for complete search history.

(56) References Cited

U.S. PATENT DOCUMENTS

| | | | |
|---|---|---|---|
| 2011/0061905 A1* | 3/2011 | Hwang | H05K 3/10 29/830 |
| 2021/0212196 A1 | 7/2021 | Ito et al. | |

FOREIGN PATENT DOCUMENTS

| | | |
|---|---|---|
| JP | 2022-030666 A | 2/2022 |
| JP | 2022-078438 A | 5/2022 |
| JP | 2023-066606 A | 5/2023 |

\* cited by examiner

WIRING CIRCUIT BOARD AND METHOD OF PRODUCING THE WIRING CIRCUIT BOARD

CROSS-REFERENCE TO RELATED APPLICATION

The present application claims priorities from Japanese Patent Application No. 2022-096919 filed on Jun. 15, 2022 and Japanese Patent Application No. 2022-168719 filed on Oct. 20, 2022, both of which are hereby incorporated by reference into this application.

TECHNICAL FIELD

The present invention relates to a wiring circuit board and a method of producing the wiring circuit board.

BACKGROUND ART

There has conventionally been a known wiring circuit board including a metal supporting board, a first metal layer disposed on the metal supporting board, an insulating layer disposed on the first metal layer, a second metal layer disposed on the insulating layer, and a conductive layer disposed on the second metal layer, wherein the conductive layer and the metal supporting board are electrically connected to each other through a via (for example, see Patent document 1 below).

CITATION LIST

Patent Document
   Patent Document 1: Japanese Unexamined Patent Publication No. 2022-30666

SUMMARY OF THE INVENTION

Problem to be Solved by the Invention

To achieve the electrical connection with low resistance between the conductive layer and the metal supporting board, the first metal layer is removed from the part in which the via is to be formed by etching, and the via formed of the second metal layer and the conductive layer is in direct contact with the metal supporting board in the wiring circuit board described in Patent Document 1.

Thus, not only the first metal layer but also the metal layer (metal supporting board) under the first metal layer may be etched.

The present invention provides a wiring circuit board in which the metal layer under the first metal thin film is protected and the electrical resistance between the conductive pattern and the metal layer under the first metal thin film can be reduced, and a method of producing the wiring circuit board.

Means for Solving the Problem

The present invention [1] includes a wiring circuit board including: a metal supporting layer; a first metal thin film disposed on the metal supporting layer; an insulating layer disposed on the first metal thin film and including a through hole; a second metal thin film disposed on the insulating layer and also disposed on the first metal thin film in the through hole; and a conductive pattern disposed on the second metal thin film and electrically connected to the metal supporting layer through the first metal thin film and the second metal thin film in the through hole, wherein the first metal thin film includes an oxide coating at least on a contact surface in contact with the insulating layer, and wherein in a central part of the through hole, the oxide coating has a thickness of 0 or a thickness smaller than a thickness of the oxide coating on the contact surface.

In the structure described above, at least only a part of the oxide coating of the first metal thin film is removed in the through hole, and this structure allows the conductive pattern and the metal supporting layer to be electrically connected to each other while the first metal thin film remains.

Thus, the first metal thin film protects the metal supporting layer (the metal layer under the first metal thin film), and the electrical resistance between the conductive pattern and the metal supporting layer can be reduced by the removal of the oxide coating.

The present invention [2] includes a wiring circuit board comprising: a metal supporting layer; a first metal thin film disposed on the metal supporting layer; an insulating layer disposed on the first metal thin film and including a through hole; a second metal thin film disposed on the insulating layer and also disposed on the first metal thin film in the through hole; and a conductive pattern disposed on the second metal thin film and electrically connected to the metal supporting layer through the first metal thin film and the second metal thin film in the through hole, wherein in a central part of the through hole, the first metal thin film has a thickness smaller than a thickness of the first metal thin film between the metal supporting layer and the insulating layer.

In the structure described above, a part of the first metal thin film is removed in the through hole, and this structure allows the conductive pattern and the metal supporting layer to be electrically connected to each other while the first metal thin film remains.

Thus, the first metal thin film protects the metal supporting layer (the metal layer under the first metal thin film), and the electrical resistance between the conductive pattern and the metal supporting layer can be reduced by the thinning of the first metal thin film.

The present invention [3] includes a wiring circuit board comprising: a metal supporting layer; a first metal thin film disposed on the metal supporting layer; an insulating layer disposed on the first metal thin film and including a through hole; a second metal thin film disposed on the insulating layer; a third metal thin film disposed on the metal supporting layer in the through hole; and a conductive pattern disposed on the second metal thin film, also disposed on the third metal thin film in the through hole, and electrically connected to the metal supporting layer through the third metal thin film, wherein in a central part of the through hole, the third metal thin film has a thickness smaller than a total of a thickness of the first metal thin film between the metal supporting layer and the insulating layer and a thickness of the second metal thin film between the insulating layer and the conductive pattern and larger than the thickness of the first metal thin film between the metal supporting layer and the insulating layer or the thickness of the second metal thin film between the insulating layer and the conductive pattern.

In the structure described above, a part of the first metal thin film is removed in the through hole while the first metal thin film remains, and the second metal thin film is formed on the first metal thin film. This structure allows the conductive pattern and the metal supporting layer to be electrically connected to each other through the third metal thin film formed of the first metal thin film and the second metal thin film while the first metal thin film remains.

Thus, the first metal thin film protects the metal supporting layer (the metal layer under the first metal thin film), and the electrical resistance between the conductive pattern and the metal supporting layer can be reduced by the thinning of the first metal thin film.

The present invention [4] includes the wiring circuit board described in any one of the above-described [1] to [3], further comprising: an intermediate metal layer disposed between the metal supporting layer and the first metal thin film and having higher electrical conductivity than electrical conductivity of the metal supporting layer.

The structure described above enables the first metal thin film to protect the intermediate metal layer (the metal layer under the first metal thin film) and allows for the reduction in the electrical resistance between the conductive pattern and the intermediate metal layer even when the intermediate metal layer exists between the metal supporting layer and the first metal thin film.

The present invention [5] includes the wiring circuit board described in any one of the above-described [1] to [4], wherein the first metal thin film contains at least one of chromium, nickel, copper, titanium, tungsten, and molybdenum.

The present invention [6] includes the wiring circuit board described in any one of the above-described [1] to [4], wherein the first metal thin film is made of chromium.

The present invention [7] includes a method of producing the wiring circuit board described in any one of the above-described [1] to [6], the method comprising: a first step of preparing the metal supporting layer; a second step of forming the first metal thin film after the first step; a third step of forming the insulating layer after the second step; a fourth step of etching a surface of the first metal thin film in the through hole after the third step; a fifth step of forming the second metal thin film after the fourth step; and a sixth step of forming the conductive pattern after the fifth step.

The present invention [8] includes the method described in the above-described [7], wherein in the fourth step, a surface of the first metal thin film in the through hole is etched by plasma etching using at least one selected from helium, neon, argon, krypton, and xenon.

Effects of the Invention

The wiring circuit board of the present invention allows for the protection of the metal layer (the metal supporting layer or the intermediate metal layer) under the first metal thin film and the reduction in the electrical resistance between the conductive pattern and the metal layer under the first metal thin film.

The method of producing the wiring circuit board of the present invention allows for the production of the wiring circuit board described above.

BRIEF DESCRIPTION OF THE DRAWINGS

FIGS. 3A to 3C are explanatory views to explain a method of producing the wiring circuit board illustrated in FIG. 1.

Subsequently to FIG. 3C, FIGS. 4A to 4C are explanatory views to explain the method of producing the wiring circuit board illustrated in FIG. 1.

DESCRIPTION OF THE EMBODIMENT

1. Wiring Circuit Board

First, a wiring circuit board 1 is described.

Figure 1:
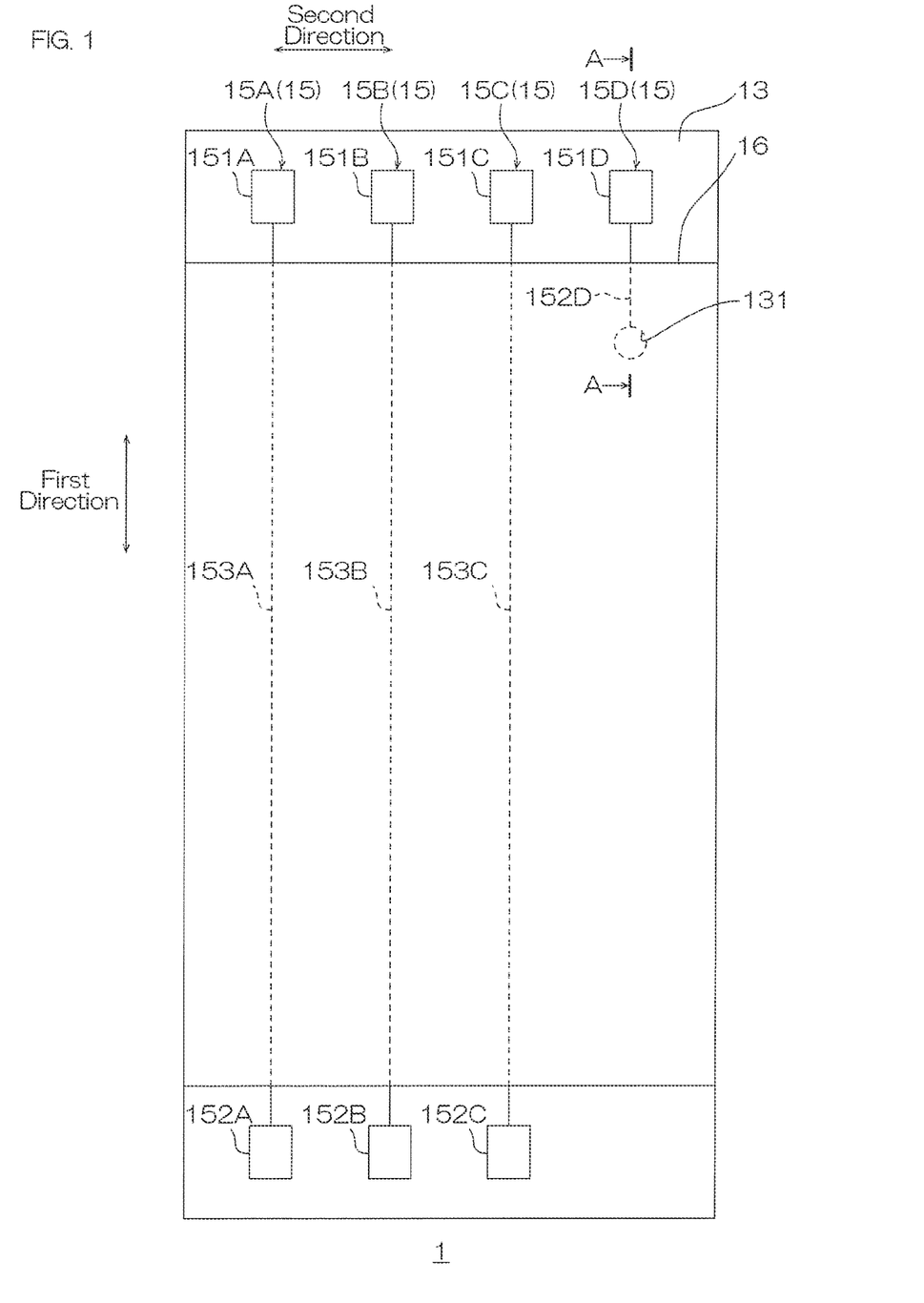
FIG. 1 is a plan view of a wiring circuit board.

As illustrated in FIG. 1, the wiring circuit board 1 extends in a first direction and a second direction. In the present embodiment, the wiring circuit board 1 has an approximately rectangular shape. The shape of the wiring circuit board 1 is not limited.

Figure 2:
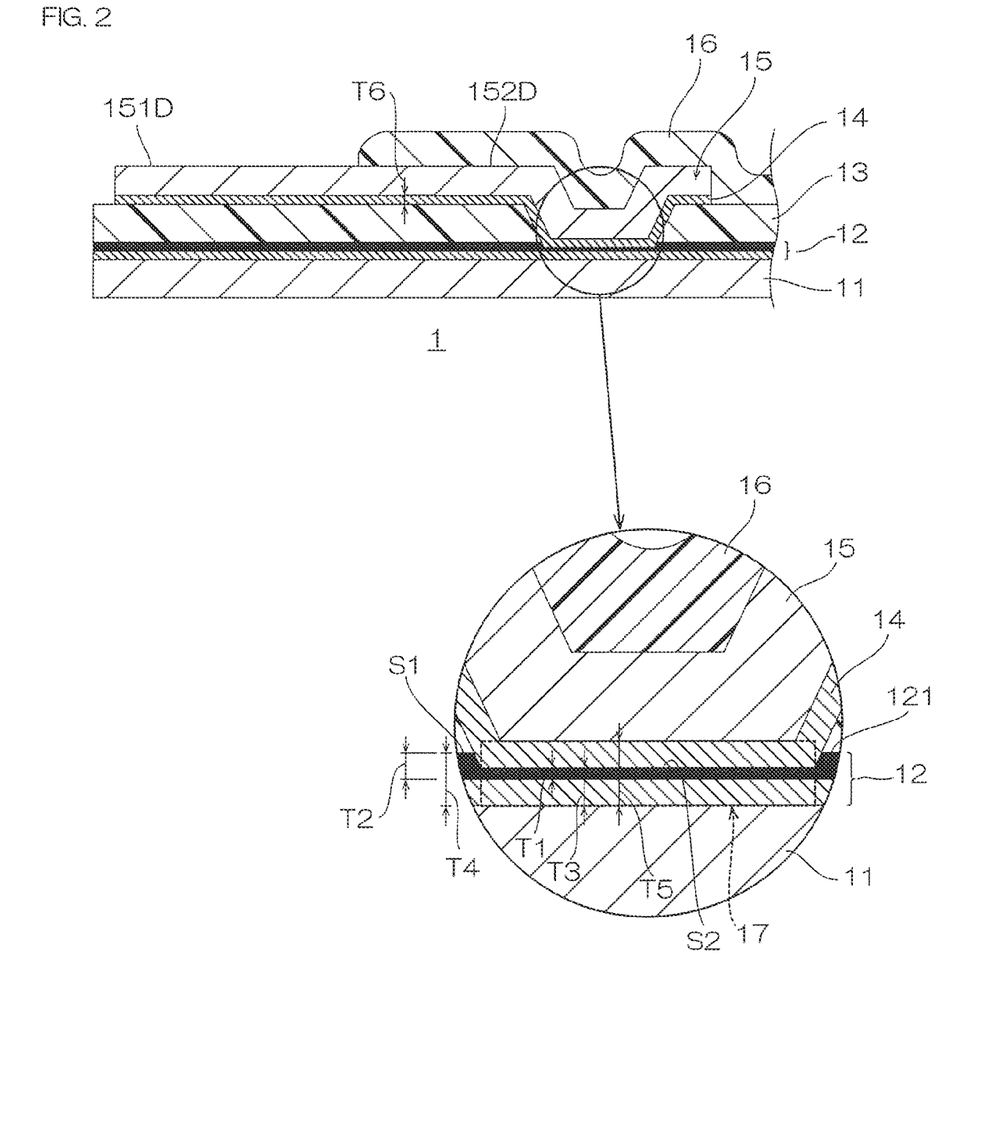
FIG. 2 is a cross-sectional view of the wiring circuit board illustrated in FIG. 1, taken along line A-A.

As illustrated in FIG. 2, the wiring circuit board 1 includes a metal supporting layer 11, a first metal thin film 12, an insulating layer 13, a second metal thin film 14, a conductive pattern and a cover layer 16.

(1) Metal Supporting Layer

The metal supporting layer 11 supports the first metal thin film 12, the insulating layer 13, the second metal thin film 14, the conductive pattern 15, and the cover layer 16. In the present embodiment, examples of the material of the metal supporting layer 11 include the stainless-steels and copper alloys.

(2) First Metal Thin Film

The first metal thin film 12 is disposed on the metal supporting layer 11 in a thickness direction of the wiring circuit board 1. The thickness direction is orthogonal to the first direction and the second direction. The first metal thin film 12 is disposed between the metal supporting layer 11 and the insulating layer 13. The first metal thin film 12 protects the metal supporting layer 11. Examples of the material of the first metal thin film 12 include chromium, nickel, copper, titanium, tungsten, molybdenum, and alloys thereof. That is to say, the first metal thin film 12 contains at least one of chromium, nickel, copper, titanium, tungsten, and molybdenum. Preferably, the first metal thin film 12 is made of chromium.

The first metal thin film 12 includes an oxide coating 121 on a contact surface S1 in contact with the insulating layer 13 and on a contact surface S2 in contact with the second metal thin film 14. The contact surface S2 in contact with the second metal thin film 14 is disposed at an inside of a through hole 131 of the insulating layer 13. The through hole 131 is described below.

The thickness of the oxide coating 121 on the contact surface S2 is smaller than that of the oxide coating 121 on the contact surface S1. In detail, at least in a central part of the through hole 131, a thickness T1 of the oxide coating 121 on the contact surface S2 is smaller than a thickness T2 of the oxide coating 121 on the contact surface S1. In this manner, the electrical resistance between the first metal thin film 12 and the second metal thin film 14 can be reduced. In this manner, while the first metal thin film 12 protects the metal supporting layer 11, the electrical resistance between the conductive pattern 15 and the metal supporting layer 11 can be reduced.

The thickness T1 of the oxide coating 121 on the contact surface S2 is, for example, 5 nm or less, preferably 3 nm or less.

The thickness T2 of the oxide coating 121 on the contact surface S1 is, for example, 1 nm or more, and, for example, 10 nm or less.

Provided that the thickness T2 of the oxide coating 121 on the contact surface S1 is 100%, the thickness T1 of the oxide coating 121 on the contact surface S2 is, for example, 85% or less, preferably 70% or less.

Not only the oxide coating 121 on the contact surface S2 is thin but also, at least in the central part of the through hole 131, a thickness T3 of the first metal thin film 12 is smaller than a thickness T4 of the first metal thin film 12 between the metal supporting layer 11 and the insulating layer 13. Thus, while the first metal thin film 12 protects the metal supporting layer 11, the electrical resistance between the conductive pattern 15 and the metal supporting layer 11 can be reduced.

The thickness T3 of the first metal thin film 12 in the central part of the through hole 131 is, for example, 100 nm or less, preferably 75 nm or less, and, for example, 5 nm or more.

The thickness T4 of the first metal thin film 12 between the metal supporting layer 11 and the insulating layer 13 is, for example, 100 nm or less, preferably 50 nm or less, and, for example, 5 nm or more.

Provided that the thickness T4 of the first metal thin film 12 between the metal supporting layer 11 and the insulating layer 13 is 100%, the thickness T3 of the first metal thin film 12 in the central part of the through hole 131 is, for example, 96% or less, preferably 92% or less, and, for example, 50% or more.

(3) Insulating Layer

The insulating layer 13 is disposed on the first metal thin film 12 in the thickness direction. In other words, the insulating layer 13 is disposed on the metal supporting layer 11 through the first metal thin film 12 in the thickness direction. The insulating layer 13 is disposed between the metal supporting layer 11 and the conductive pattern 15. The insulating layer 13 insulates the metal supporting layer 11 from the conductive pattern 15. The insulating layer 13 is made of resin. Examples of the resin include polyimide, maleimide, epoxy resin, polybenzoxazole, and polyester. The insulating layer 13 has the through hole 131. The through hole 131 is a via hole.

(4) Second Metal Thin Film

The second metal thin film 14 is disposed on the insulating layer 13 in the thickness direction. The second metal thin film 14 is disposed between the insulating layer 13 and the conductive pattern 15. The second metal thin film 14 protects the conductive pattern 15. Examples of the material of the second metal thin film 14 include chromium, nickel, copper, titanium, tungsten, molybdenum, and alloys thereof. The second metal thin film 14 preferably is made of chromium. The second metal thin film 14 is disposed on the first metal thin film 12 in the through hole 131. In this manner, a third metal thin film 17 formed of the first metal thin film 12 and the second metal thin film 14 is formed in the through hole 131. That is to say, the wiring circuit board 1 includes the third metal thin film 17 in the through hole 131. The third metal thin film 17 is disposed on the metal supporting layer 11 in the thickness direction. The third metal thin film 17 is disposed between the metal supporting layer 11 and the conductive pattern 15 in the thickness direction.

At least in the central part of the through hole 131, a thickness T5 of the third metal thin film 17 is smaller than the total of the thickness T4 of the first metal thin film 12 between the metal supporting layer 11 and the insulating layer 13 and a thickness T6 of the second metal thin film 14 between the insulating layer 13 and the conductive pattern 15. Furthermore, at least in the central part of the through hole 131, the thickness T5 of the third metal thin film 17 is larger than the thickness T4 of the first metal thin film 12 between the metal supporting layer 11 and the insulating layer 13 or the thickness T6 of the second metal thin film 14 between the insulating layer 13 and the conductive pattern 15. Thus, while the first metal thin film 12 protects the metal supporting layer 11, the electrical resistance between the conductive pattern 15 and the metal supporting layer 11 can be reduced.

The thickness T5 of the third metal thin film 17 in the central part of the through hole 131 is, for example, 200 nm or less, preferably 150 nm or less, and, for example, 10 nm or more.

The thickness T6 of the second metal thin film 14 between the insulating layer 13 and the conductive pattern 15 is, for example, 200 nm or less, preferably 100 nm or less, and, for example, 10 nm or more.

(5) Conductive Pattern

The conductive pattern 15 is disposed on the second metal thin film 14 in the thickness direction. In other words, the conductive pattern 15 is disposed on the insulating layer 13 through the second metal thin film 14 in the thickness direction. The conductive pattern 15 is disposed at an opposite side to the metal supporting layer 11 relative to the insulating layer 13 in the thickness direction. The conductive pattern 15 is made of metal. Examples of the metal include, for example, copper, silver, gold, iron, aluminum, chromium, and alloys thereof. In view of obtaining excellent electric properties, copper is preferably used. The shape of the conductive pattern 15 is not limited.

In the present embodiment, as illustrated in FIG. 1, the conductive pattern 15 includes a plurality of wiring patterns 15A, 15B, and 15C, and a ground pattern 15D. The wiring patterns 15B, and 15C, and the ground pattern 15D are arranged at intervals in the second direction.

(5-1) Wiring Pattern

The wiring pattern 15A includes a terminal 151A, a terminal 152A, and a wire 153A. The wiring pattern 15A electrically connects an electronic component connected with the terminal 151A to an electronic component connected with the terminal 152A.

The terminal 151A is disposed on one end portion of the wiring circuit board 1 in the first direction. The terminal 151A has a square land shape.

The terminal 152A is disposed on the other end portion of the wiring circuit board 1 in the first direction. The terminal 152A has a square land shape.

One end of the wire 153A is connected to the terminal 151A. The other end of the wire 153A is connected to the terminal 152A. The wire 153A electrically connects the terminal 151A to the terminal 152A.

Each of the wiring patterns 15B and 15C are described in the same manner as the wiring pattern 15A is. Thus, the description of each of the wiring patterns 15B and 15C is omitted.

(5-2) Ground Pattern

The ground pattern 15D has a ground terminal 151D and a ground wire 152D. The ground pattern 15D connects an electronic component connected to the ground terminal 151D with ground through the metal supporting layer 11.

The ground terminal 151D is disposed at the one end portion of the wiring circuit board 1 in the first direction. The ground terminal 151D has a square land shape. The terminals 151A, 151B, and 151C and the ground terminal 151D are arranged at intervals in the second direction.

One end of the ground wire 152D is connected to the ground terminal 151D. The other end of the ground wire 152D is connected to the metal supporting layer 11 through the through hole 131 of the insulating layer 13 (see FIG. 2).

In detail, as illustrated in FIG. 2, in the through hole 131, the other end of the ground wire 152D is disposed on the second metal thin film 14. In other words, the conductive pattern is disposed on the third metal thin film 17 in the through hole 131. The other end of the ground wire 152D is in contact with the second metal thin film 14. In this manner, the ground wire 152D is electrically connected to the metal supporting layer 11 through the first metal thin film 12 and the second metal thin film 14. In other words, the conductive pattern 15 is electrically connected to the metal supporting layer 11 through the first metal thin film 12 and the second metal thin film 14 (i.e., the third metal thin film 17) in the through hole 131.

(6) Cover Layer

As illustrated in FIG. 1, the cover layer 16 covers all the wires 153A, 153B, and 153C, and the ground wire 152D. In other words, the cover layer 16 covers the conductive pattern 15. The cover layer 16 is disposed on the insulating layer 13 in the thickness direction. The cover layer 16 does not cover the terminals 151A, 151B, and 151C, the ground terminal 151D, and the terminals 152A, 152B, and 152C. The cover layer 16 is made of insulating resin. Examples of the resin include polyimide, maleimide, epoxy resin, polybenzoxazole, and polyester.

2. Method of Producing Wiring Circuit Board

Next, a method of producing the wiring circuit board 1 is described.

In the present embodiment, the wiring circuit board 1 is produced in an additive method.

To produce the wiring circuit board 1, a first step (see FIG. 3A), a second step (see FIG. 3B), a third step (see FIG. 3C), a fourth step (see FIG. 4A), a fifth step (see FIG. 4B), and a sixth step (see FIG. 4C) are carried out in this order. That is to say, the method of producing the wiring circuit board 1 includes the first step (see FIG. 3A), the second step (see FIG. 3B), the third step (see FIG. 3C), the fourth step (see FIG. 4A), the fifth step (see FIG. 4B), and the sixth step (see FIG. 4C).

(1) First Step

Figure 3A:
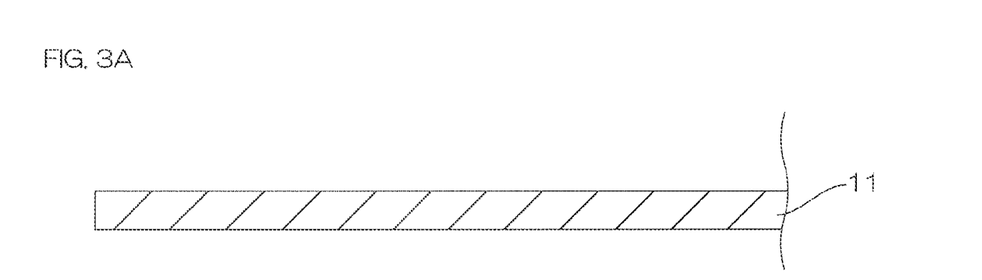
FIG. 3A illustrates a step (first step) of preparing a metal supporting layer.

As illustrated in FIG. 3A, in the first step, the metal supporting layer 11 is prepared. In the present embodiment, the metal supporting layer 11 is metal foil pulled out of a roll of metal foil.

(2) Second Step

Figure 3B:
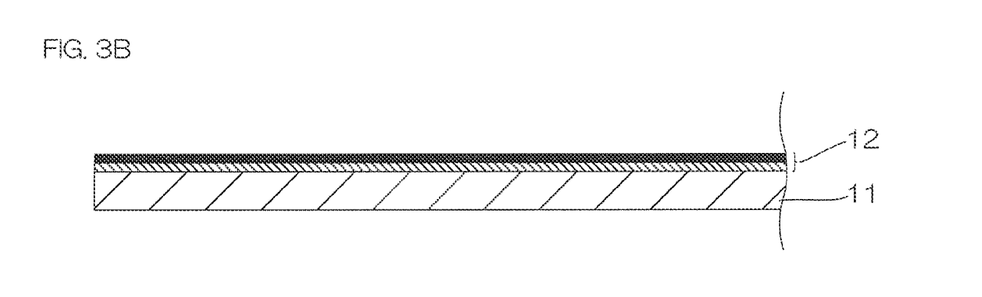
FIG. 3B illustrates a step (second step) of forming a first metal thin film.

Next, as illustrated in FIG. 3B, in the second step after the first step, the first metal thin film 12 is formed on the metal supporting layer 11. The first metal thin film 12 is formed, for example, by sputtering.

After the second step, the surface of the first metal thin film 12 is oxidized by the contact with the air during the transfer to the next step. In this manner, the oxide coating 121 is formed on the surface of the first metal thin film 12.

(3) Third Step

Figure 3C:
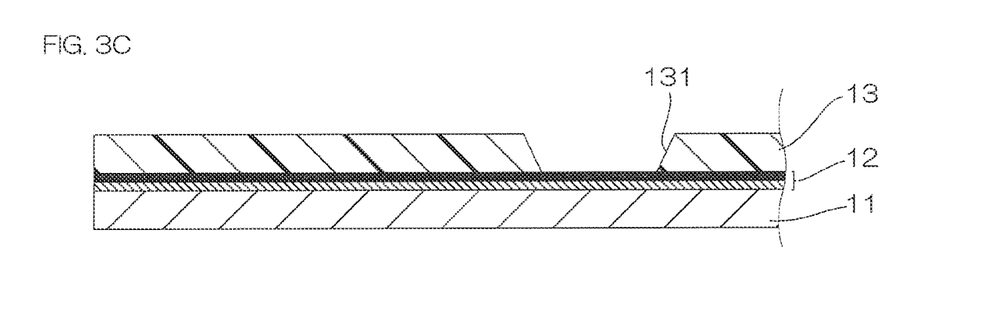
FIG. 3C illustrates a step (third step) of forming an insulating layer.

Next, as illustrated in FIG. 3C, in the third step after the second step, the insulating layer 13 is formed on the first metal thin film 12.

To form the insulating layer 13, first, a solution (varnish) of photosensitive resin is applied and dried on the first metal thin film 12 to form a film of the photosensitive resin. Next, the photosensitive resin film is exposed and developed. In this manner, the insulating layer 13 is formed on the first metal thin film 12. A part of the first metal thin film 12 is exposed through the through hole 131 of the insulating layer 13.

(4) Fourth Step

Figure 4A:
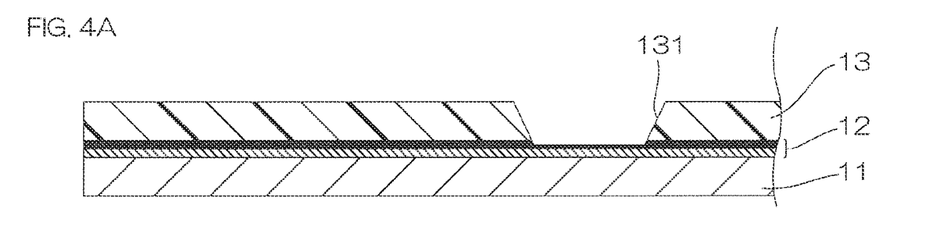
FIG. 4A illustrates a step (fourth step) of etching the surface of the first metal thin film in the through hole.

Next, as illustrated in FIG. 4A, in the fourth step after the third step, the surface of the first metal thin film 12 in the through hole 131 is etched. In this manner, a part of the oxide coating 121 of the first metal thin film 12 is removed in the through hole 131. In this manner, at least in the central part of the through hole 131, the thickness T1 of the oxide coating 121 on the contact surface S2 becomes smaller than the thickness T2 of the oxide coating 121 on the contact surface S1.

Examples of the method of etching the surface of the first metal thin film 12 include plasma etching and wet etching.

Examples of the method of discharging in plasma etching include a capacitively coupled plasma, an inductively coupled plasma, an electron cyclotron resonance plasma, a magnetic neutral line discharge plasma, and a DC plasma. Examples of the structure of the plasma etching device include a parallel plate type, a barrel type, a remote plasma type, and an ion beam type.

Further, the plasma electrode surface may be inclined relative to the surface of the first metal thin film 12. The inclination angle formed between a direction perpendicular to the plasma electrode and a direction perpendicular to the surface of the first metal thin film 12 is, for example, 10° or more and 65° or less. When the inclination angle falls within the above-described range, the efficiencies in etching can be improved.

Preferably, plasma etching using at least one selected from a noble gas, a reactive gas, and another gas is carried out in the fourth step to etch the surface of the first metal thin film 12 in the through hole 131. Examples of the noble gas include helium, neon, argon, krypton, and xenon. Examples of the reactive gas include a halogen gas. Examples of the halogen gas include tetrafluoromethane ($CF_4$), trifluoromethane ($CHF_3$), and chlorine. Examples of another gas include oxygen, nitrogen, and hydrogen.

If the etching of the whole of the first metal thin film 12 in the through hole 131 is carried out, not only the first metal thin film 12 in the through hole 131 but also even the metal supporting layer 11 under the first metal thin film 12 may be etched. Especially, when wet etching is employed as the method of etching the first metal thin film 12, the etching solution may etch the metal supporting layer 11 under the first metal thin film 12 and may further etch the first metal thin film 12 between the metal supporting layer 11 and the insulating layer 13.

In light of the foregoing, etching the surface of the first metal thin film 12 in the through hole 131 allows the first metal thin film 12 to remain in the through hole 131. Thus, the etching of the metal supporting layer 11 under the first metal thin film 12 and the further etching of the first metal thin film 12 between the metal supporting layer 11 and the insulating layer 13 can be suppressed.

Especially, by carrying out plasma etching to etch the surface of the first metal thin film 12, the surface of the first metal thin film 12 in the through hole 131 can be etched without etching the first metal thin film 12 between the metal supporting layer 11 and the insulating layer 13.

(5) Fifth Step

Figure 4B:
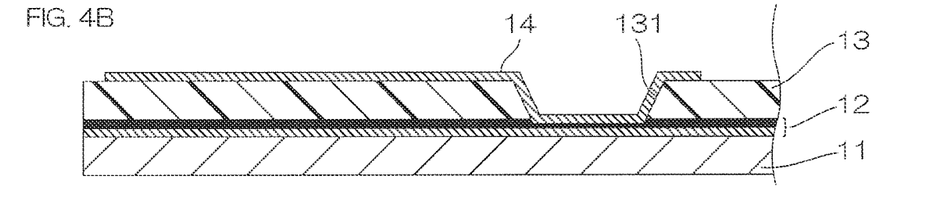
FIG. 4B illustrates a step (fifth step) of forming a second metal thin film.

Next, as illustrated in FIG. 4B, in the fifth step after the fourth step, the second metal thin film 14 is formed on the insulating layer 13. The second metal thin film 14 is formed, for example, by sputtering. The second metal thin film 14 is formed on the first metal thin film 12 in the through hole 131. In this manner, in the through hole 131, the third metal thin film 17 formed of the first metal thin film 12 and the second metal thin film 14 is formed on the metal supporting layer 11.

(6) Sixth Step

Figure 4C:
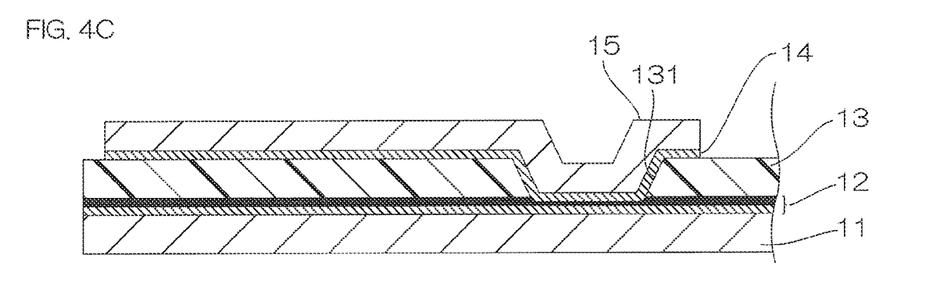
FIG. 4C illustrates a step (sixth step) of forming a conductive pattern.

Next, as illustrated in FIG. 4C, in the sixth step after the fifth step, the conductive pattern 15 is formed on the second metal thin film 14.

In detail, a plating resist is laminated on the second protective layer 14. The plating resist is exposed while the part on which the conductive pattern 15 is to be formed is shielded from the light.

Next, the exposed plating resist is developed. This development removes the plating resist from the shielded parts. The second protective layer 14 is exposed at the part on which the conductive pattern 15 is to be formed. The plating resist at the exposed parts, i.e., the parts on which the conductive pattern 15 is not to be formed remains.

Next, the conductive pattern 15 is formed on the exposed second metal thin film 14 by electrolytic plating. This forms the other end of the ground wire 152D on the second metal thin film 14 in the through hole 131. In this manner, the ground wire 152D is electrically connected to the metal supporting layer 11 through the first metal thin film 12 and the second metal thin film 14 (i.e., the third metal thin film 17).

After the completion of the electrolytic plating, the plating resist is removed. Thereafter, the second metal thin film 14 covered with the plating resist is removed by etching.

Thereafter, in the same manner as the formation of the insulating layer 13, the cover layer 16 is formed on the insulating layer 13 and the conductive pattern 15 (see FIG. 1 and FIG. 2).

3. Operations and Effects (1) In the wiring circuit board 1, as illustrated in FIG. 2, at least only a part of the oxide coating 121 of the first metal thin film 12 is removed in the through hole 131, and the conductive pattern 15 and the metal supporting layer 11 are electrically connected to each other while the first metal thin film 12 remains.

At least in the central part of the through hole 131, the thickness T1 of the oxide coating 121 on the contact surface S2 is smaller than the thickness T2 of the oxide coating 121 on the contact surface S1.

Thus, the first metal thin film 12 protects the metal supporting layer 11 (the metal layer under the first metal thin film 12), and the oxide coating 121 is removed. This can reduce the electrical resistance between the conductive pattern 15 and the metal supporting layer 11.

(2) In the wiring circuit board 1, as illustrated in FIG. 2, a part of the first metal thin film 12 is removed in the through hole 131, and the conductive pattern 15 and the metal supporting layer 11 can electrically be connected to each other while the first metal thin film 12 remains.

At least in the central part of the through hole 131, the thickness T3 of the first metal thin film 12 is smaller than the thickness T4 of the first metal thin film 12 between the metal supporting layer 11 and the insulating layer 13.

Thus, the first metal thin film 12 protects the metal supporting layer 11 (the metal layer under the first metal thin film 12) while the first metal thin film 12 is thinned. This can reduce the electrical resistance between the conductive pattern 15 and the metal supporting layer 11.

(3) In the wiring circuit board 1, a part of the first metal thin film 12 is removed in the through hole 131 as illustrated in FIG. 3C and FIG. 4A, and the second metal thin film 14 is formed on the first metal thin film 12 while the first metal thin film 12 remains as illustrated in FIG. 4B.

Thus, as illustrated in FIG. 2, while the first metal thin film 12 remains, the conductive pattern 15 and the metal supporting layer 11 can electrically be connected to each other through the third metal thin film 17 formed of the first metal thin film 12 and the second metal thin film 14.

Thus, the first metal thin film 12 protects the metal supporting layer 11 (the metal layer under the first metal thin film 12), and the first metal thin film 12 is thinned. This can reduce the electrical resistance between the conductive pattern 15 and the metal supporting layer 11.

4. Variations

Next, variations are described. In each of the variations, the same members as in the above-described embodiment are given the same reference numerals, and the detailed descriptions thereof are omitted.

Figure 5:
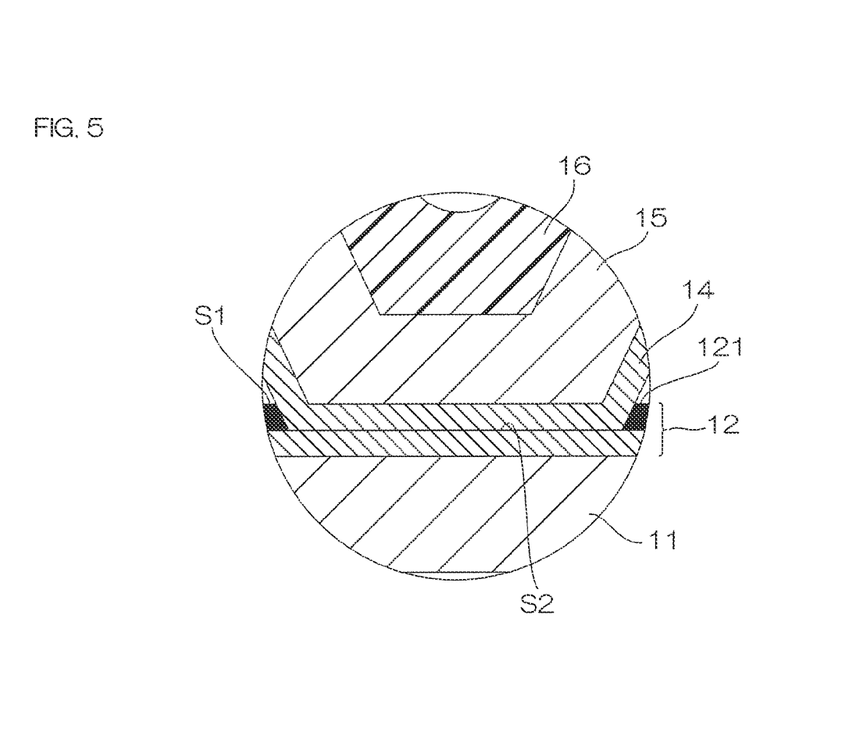
FIG. 5 is an explanatory view to explain a variation (1).

(1) As illustrated in FIG. 5, in the central part of the through hole 131, the oxide coating 121 may completely be removed. In other words, in the central part of the through hole 131, the thickness of the oxide coating 121 may be 0. In the first metal thin film 12, the part other than the oxide coating 121 remains. When the thickness of the oxide coating 121 is 0, the electrical resistance between the conductive pattern 15 and the metal supporting layer 11 can further be reduced.

Figure 6:
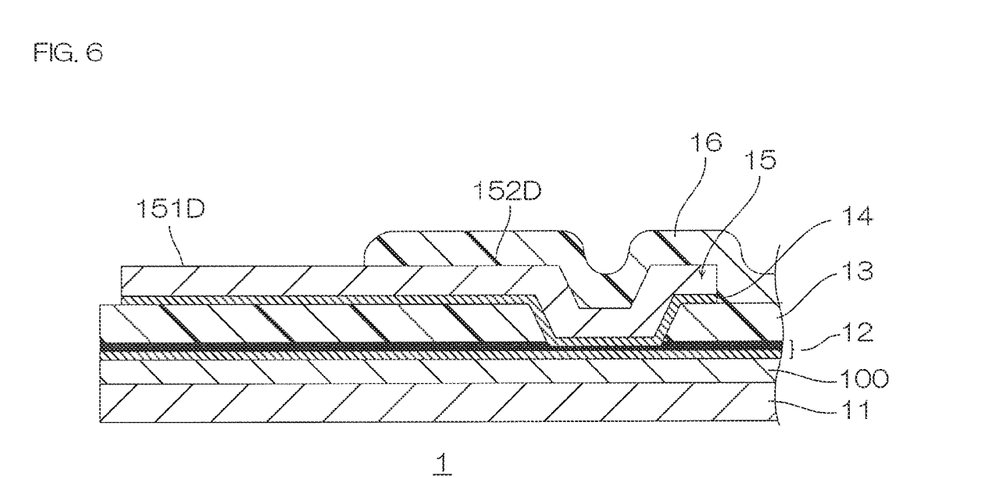
FIG. 6 is an explanatory view to explain a variation (2).

(2) As illustrated in FIG. 6, the wiring circuit board 1 may further include an intermediate metal layer 100. The intermediate metal layer 100 is disposed between the metal supporting layer 11 and the first metal thin film 12.

The intermediate metal layer 100 has higher electrical conductivity than the metal supporting layer 11 does. Examples of the intermediate metal layer 100 include at least one selected from the group consisting of gold, silver, and copper. The intermediate metal layer 100 preferably is made of at least one selected from the group consisting of gold, silver, and copper. When the metal supporting layer 11 is a copper alloy, the intermediate metal layer 100 preferably is made of copper.

The intermediate metal layer 100 is formed on the metal supporting layer 11, for example, by sputtering, plating, or vacuum deposition.

(3) In the variation (1) or (2), the same operations and effects as the embodiment described above can be achieved.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The wiring circuit board of the present invention is used for the connection with an electronic component. The method of producing the wiring circuit board of the present invention is used for the production of wiring circuit boards.

DESCRIPTION OF REFERENCE NUMERALS 1 wiring circuit board
11 metal supporting layer
12 first metal thin film
13 insulating layer 14 second metal thin film
15 conductive pattern
17 third metal thin film
100 intermediate metal layer
121 oxide coating
131 through hole
S1 contact surface

The invention claimed is:

1. A wiring circuit board comprising: a metal supporting layer; a first metal thin film disposed on the metal supporting layer; an insulating layer disposed on the first metal thin film and including a through hole; a second metal thin film disposed on the insulating layer and also disposed on the first metal thin film in the through hole; and a conductive pattern disposed on the second metal thin film and electrically connected to the metal supporting layer through the first metal thin film and the second metal thin film in the through hole, wherein the first metal thin film includes a first contact surface in contact with the insulating layer and a second contact surface in contact with the second metal thin film, wherein an oxide coating formed by oxidization of the first metal thin film exists at least on the first contact surface, and wherein in a central part of the through hole, the oxide coating either does not exist on the second contact surface, or the oxide coating on the second contact surface is thinner than the oxide coating on the first contact surface.

2. The wiring circuit board according to claim 1, further comprising:
an intermediate metal layer disposed between the metal supporting layer and the first metal thin film and having higher electrical conductivity than electrical conductivity of the metal supporting layer.

3. The wiring circuit board according to claim 1, wherein the first metal thin film contains at least one of chromium, nickel, copper, titanium, tungsten, and molybdenum.

4. The wiring circuit board according to claim 1, wherein the first metal thin film is made of chromium.

5. A method of producing the wiring circuit board according to claim 1, the method comprising:
a first step of preparing the metal supporting layer;
a second step of forming the first metal thin film after the first step;
a third step of forming the insulating layer after the second step;
a fourth step of etching a surface of the first metal thin film in the through hole after the third step;
a fifth step of forming the second metal thin film after the fourth step; and
a sixth step of forming the conductive pattern after the fifth step.

6. The method according to claim 5, wherein in the fourth step, a surface of the first metal thin film in the through hole is etched by plasma etching using at least one selected from helium, neon, argon, krypton, and xenon.

* * * * *